(12) United States Patent
Ji et al.

(10) Patent No.: US 11,476,151 B2
(45) Date of Patent: Oct. 18, 2022

(54) VACUUM CHUCK, SUBSTRATE PROCESSING APPARATUS INCLUDING THE SAME AND RELATED METHOD OF MANUFACTURE

(71) Applicant: Samsung Electronics Co., Ltd., Suwon-si (KR)

(72) Inventors: Byounghoon Ji, Hwaseong-si (KR); Seoyoung Maeng, Seoul (KR); Minjoon Kim, Gwangmyeong-si (KR); Jongyong Bae, Hwaseong-si (KR); Jiho Uh, Seoul (KR); Hongtaek Lim, Seoul (KR); Donghoon Han, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 259 days.

(21) Appl. No.: 16/825,352

(22) Filed: Mar. 20, 2020

(65) Prior Publication Data

US 2021/0074574 A1    Mar. 11, 2021

(30) Foreign Application Priority Data

Sep. 9, 2019    (KR) .................. 10-2019-0111560

(51) Int. Cl.
*H01L 21/683*      (2006.01)
*H01L 21/67*       (2006.01)
*H01L 21/687*      (2006.01)

(52) U.S. Cl.
CPC .... *H01L 21/6838* (2013.01); *H01L 21/67103* (2013.01); *H01L 21/68721* (2013.01)

(58) Field of Classification Search
CPC .......... H01L 21/6838; H01L 21/67103; H01L 21/68721
USPC ..................................... 156/345.52
See application file for complete search history.

(56) References Cited

U.S. PATENT DOCUMENTS

| | | | | |
|---|---|---|---|---|
| 4,574,179 A | * | 3/1986 | Masuzawa | H01J 37/3056 315/111.81 |
| 5,133,284 A | * | 7/1992 | Thomas | C30B 31/14 118/728 |
| 5,177,878 A | * | 1/1993 | Visser | C23C 16/466 34/239 |
| 5,230,741 A | * | 7/1993 | van de Ven | C23C 16/04 118/728 |

(Continued)

FOREIGN PATENT DOCUMENTS

| | | |
|---|---|---|
| EP | 0688888 A2 | 12/1995 |
| EP | 0467623 B1 | 3/1996 |
| KR | 10-0810801 B1 | 3/2008 |

*Primary Examiner* — Charlee J. C. Bennett
(74) *Attorney, Agent, or Firm* — Muir Patent Law, PLLC

(57) ABSTRACT

A vacuum chuck includes a pedestal including a first surface on which a substrate may be mounted. The first surface of the substrate may include a vacuum hole to provide a vacuum pressure below the substrate, a vacuum groove connected to the vacuum hole, and a gas hole surrounding the vacuum groove to transmit a bottom gas to the substrate. A vacuum pipe may be provided to connect to the vacuum hole, and a gas pipe may be provided to connect to the gas hole. The diameter of the vacuum hole may be about 2 to about 3 micrometers, and a width of the vacuum groove may be about 1.6 to about 2.5 micrometers.

20 Claims, 11 Drawing Sheets

(56) References Cited

U.S. PATENT DOCUMENTS

| | | | |
|---|---|---|---|
| 5,476,548 A * | 12/1995 | Lei | C23C 16/4585 |
| | | | 118/503 |
| 5,522,131 A | 6/1996 | Steger | |
| 5,556,476 A * | 9/1996 | Lei | C23C 16/4585 |
| | | | 118/728 |
| 5,611,865 A * | 3/1997 | White | C23C 16/042 |
| | | | 118/728 |
| 5,620,525 A * | 4/1997 | van de Ven | H01L 21/68771 |
| | | | 118/724 |
| 5,745,331 A * | 4/1998 | Shamouilian | H02N 13/00 |
| | | | 361/234 |
| 5,886,863 A * | 3/1999 | Nagasaki | H02N 13/00 |
| | | | 279/128 |
| 5,925,411 A | 7/1999 | Ven et al. | |
| 6,179,924 B1 * | 1/2001 | Zhao | C23C 16/52 |
| | | | 118/728 |
| 6,553,277 B1 * | 4/2003 | Yagisawa | H01L 22/34 |
| | | | 700/121 |
| 7,580,109 B2 | 8/2009 | Akaike | |
| 9,558,985 B2 | 1/2017 | Wang et al. | |
| 11,145,532 B2 * | 10/2021 | Ikeguchi | H01L 21/68785 |
| 2002/0007791 A1 * | 1/2002 | Horiguchi | H01L 21/67017 |
| | | | 118/729 |
| 2003/0173590 A1 * | 9/2003 | Liu | B24B 7/228 |
| | | | 257/200 |
| 2013/0201597 A1 * | 8/2013 | Ishikawa | H01L 21/6833 |
| | | | 361/234 |
| 2014/0017903 A1 * | 1/2014 | Bello | H01L 21/304 |
| | | | 438/758 |
| 2018/0193983 A1 * | 7/2018 | Ishino | B25B 11/005 |
| 2020/0070364 A1 * | 3/2020 | Ahn | H01L 21/6838 |
| 2021/0074574 A1 * | 3/2021 | Ji | H01L 21/6838 |

* cited by examiner

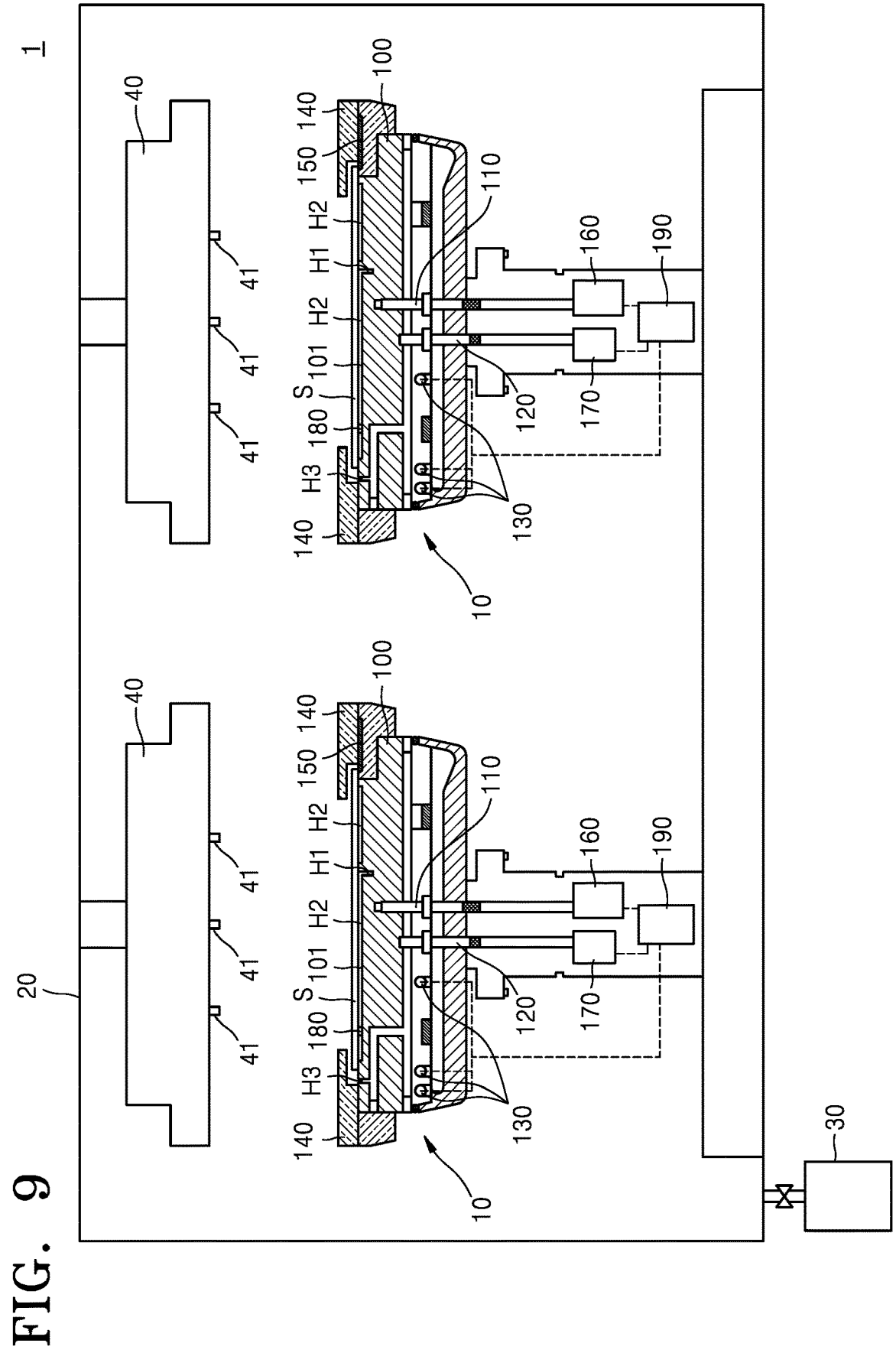

VACUUM CHUCK, SUBSTRATE PROCESSING APPARATUS INCLUDING THE SAME AND RELATED METHOD OF MANUFACTURE

CROSS-REFERENCE TO RELATED APPLICATION

This application claims the benefit of Korean Patent Application No. 10-2019-0111560, filed on Sep. 9, 2019, in the Korean Intellectual Property Office, the disclosure of which is incorporated herein in its entirety by reference.

BACKGROUND

The inventive concept relates to a vacuum chuck and a substrate processing apparatus including the vacuum chuck, and a method of manufacturing semiconductor devices using the substrate processing apparatus.

A substrate may be mounted on a vacuum chuck for processing. In more detail, a substrate, on which semiconductor devices are formed, may be mounted on a vacuum chuck via vacuum pressure provided below the substrate. Recently, as the semiconductor devices are formed on the substrate become smaller, the substrate may be provided on the vacuum chuck in a bent state. Thus, methods of stably mounting the bent substrate on the vacuum chuck have been studied. For example, methods of increasing the magnitude of vacuum pressure that a vacuum chuck provides to a substrate have been studied.

SUMMARY

The inventive concept provides a vacuum chuck for stably mounting a substrate and a substrate processing apparatus including the vacuum chuck.

The inventive concept also provides a vacuum chuck having improved heat transfer performance and a substrate processing apparatus including the vacuum chuck.

The inventive concept also provides a vacuum chuck for reducing a risk of physical damage to a substrate in a process for processing a substrate and a substrate processing apparatus including the vacuum chuck.

The inventive concept also provides for a method of manufacturing semiconductor devices with a substrate processing apparatus having an improved vacuum chuck as disclosed herein.

According to some embodiments, a vacuum chuck comprises a pedestal comprising a first surface configured to have a substrate mounted thereon, the pedestal having a vacuum groove formed in the first surface and a vacuum hole in fluid communication with the vacuum groove, wherein the vacuum groove and vacuum hole form a vacuum passage configured to provide a vacuum pressure below the substrate; a heater in the pedestal, the heater being configured to generate heat; and a vacuum pipe connected to the vacuum hole, wherein the vacuum hole has a diameter in the range of 2 to 3 micrometers, and the vacuum groove has a width in the range of 1.6 to 2.5 micrometers. According to some embodiments, a vacuum chuck comprises a pedestal comprising a first surface configured to have a substrate mounted thereon, the pedestal having a vacuum groove formed in the first surface and a vacuum hole in fluid communication with the vacuum groove, wherein the vacuum groove and vacuum hole form a vacuum passage configured to provide a vacuum pressure below the substrate, the pedestal having a gas hole formed in the first surface and surrounding the vacuum groove configured to transmit a bottom gas to the substrate; a heater in the pedestal, the heater being configured to generate heat; a vacuum pipe connected to the vacuum hole; a vacuum pump configured to provide vacuum pressure to the vacuum pipe; a gas pipe connected to the gas hole; a bottom gas supply configured to provide bottom gas to the gas pipe; a cover ring on the pedestal, the cover ring configured to overlap an edge portion of the substrate; and a clamp configured to support the substrate, wherein sidewalls of the vacuum groove meet with the first surface at respective rounded corner portions forming respective curved surfaces.

According to some examples, a substrate processing apparatus for processing a substrate comprises a chamber defining an inner space configured to process a substrate; a vacuum chuck configured to support the substrate in the inner space; a pressure pump configured to regulate pressure in the inner space; and a top gas supply above the vacuum chuck, the top gas supply comprising a nozzle configured to inject a fluid into the chamber, wherein the vacuum chuck comprises: a pedestal comprising a first surface configured to have the substrate mounted thereon, the pedestal having a first vacuum groove formed in the first surface and a first vacuum hole in fluid communication with the first vacuum groove, wherein the first vacuum groove and first vacuum hole form a vacuum passage configured to provide a vacuum pressure below the substrate, and the pedestal having a gas hole formed in the first surface and surrounding the first vacuum groove configured to transmit a bottom gas to the substrate; a heater in the pedestal, the heater being configured to generate heat; a vacuum pipe connected to the first vacuum hole; and a gas pipe connected to the gas hole, wherein a diameter of the first vacuum hole is in a range of 2 to 3 micrometers, and a width of the first vacuum groove is in a range of 1.6 to 2.5 micrometers.

BRIEF DESCRIPTION OF THE DRAWINGS

Embodiments of the inventive concept will be more clearly understood from the following detailed description taken in conjunction with the accompanying drawings in which:

FIG. 9 is a cross-sectional view of a substrate processing apparatus according to an embodiment of the inventive concept;

DETAILED DESCRIPTION OF THE EMBODIMENTS

Hereinafter, embodiments of the inventive concept will be described in detail with reference to the accompanying drawings.

Figure 1:
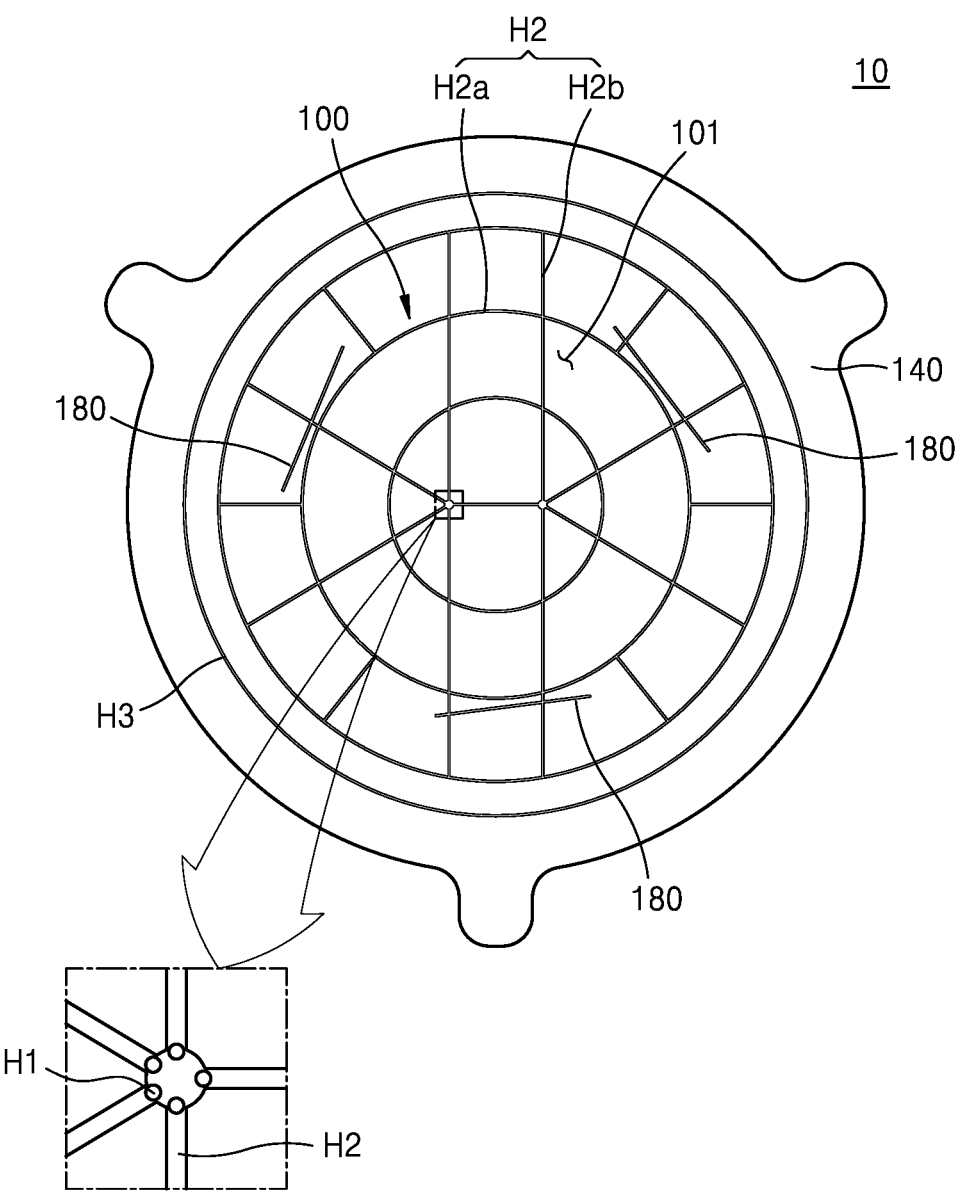
FIG. 1 is a plan view of a vacuum chuck according to an embodiment of the inventive concept.
Figure 2:
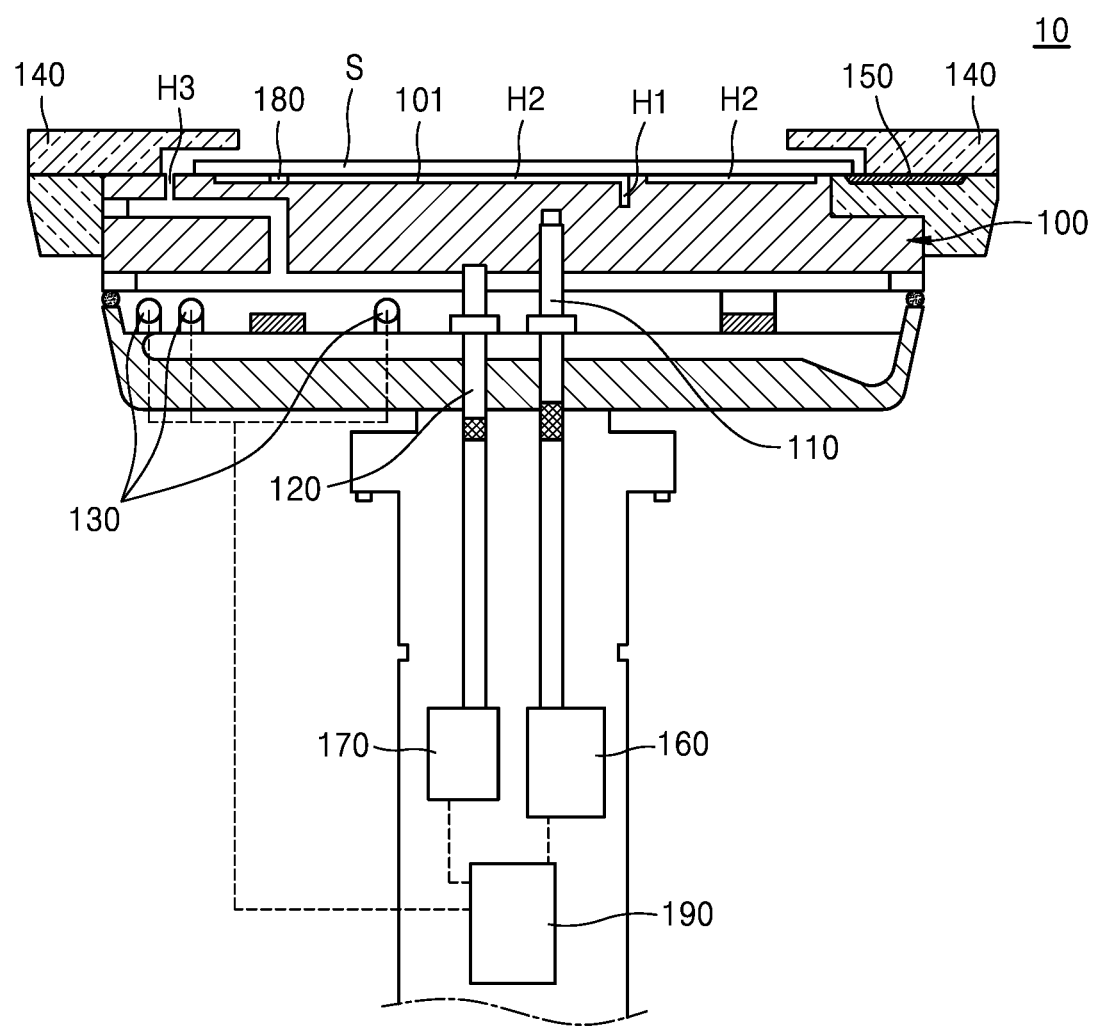
FIG. 2 is a cross-sectional view of an inner portion of a vacuum chuck according to an embodiment of the inventive concept.

FIG. 1 is a plan view of a vacuum chuck 10 according to an embodiment of the inventive concept, and FIG. 2 is a cross-sectional view of an inner portion of the vacuum chuck 10 according to an embodiment of the inventive concept. The vacuum chuck 10 according to the inventive concept may be a device configured to stably mount a substrate S in a substrate processing process. Also, the vacuum chuck 10 may be a device configured to heat the substrate S in the substrate processing process.

Referring to FIGS. 1 and 2, the vacuum chuck 10 according to an embodiment of the inventive concept may include a pedestal 100, a vacuum pipe 110, a gas pipe 120, a heater 130, a cover ring 140, a clamp 150, a vacuum pump 160, a bottom gas supply 170, an elastic support 180, and a controller 190.

According to an embodiment, the pedestal 100 may have a shape of a pillar and may be formed of a metal material. For example, the pedestal 100 may have a shape of a pillar and may be formed of aluminum (Al). Also, the pedestal 100 may be configured to support the substrate S. The substrate S supported by the pedestal 100 may be a wafer, a printed circuit board (PCB), etc., on and/or in which semiconductor devices (e.g., undiced semiconductor chips) are formed and/or mounted. It should be emphasized that the term "substrate" as used in this application is not limited to an initial substrate on which additional layers are formed (as typical in semiconductor manufacturing) but is intended to also encompass an entire wafer including such an initial substrate and additional layers formed thereon. Thus, the substrate S may be an initial substrate, such as bulk crystalline semiconductor substrate of Si, SiGe, etc., Silicon on Insulator (SOI) or other conventional initial substrates used in the manufacture of semiconductor devices. The substrate S may also be the combination of such an initial substrate and various insulator layers and conductive layers formed thereon (e.g., patterned to form the interconnections and circuitry of an integrated circuit device formed or to be formed within a wafer). The substrate S may thus also be the intermediate structure in manufacturing semiconductor devices integrally formed as a wafer. It will be appreciated that the vacuum chuck 10 may be used in a variety of semiconductor processes with a variety of substrates S and thus the structure of the substrate S mounted on the vacuum chuck 10 and being processed with the substrate processing apparatus may vary accordingly.

The pedestal 100 may include a first surface 101 (e.g., upper surface of pedestal 100) on which the substrate S is mounted. The first surface 101 of the pedestal 100 may have substantially the same shape as the substrate S. For example, when the substrate S has a circular shape, the first surface 101 of the pedestal 100 may also have a circular shape. Also, the first surface 101 of the pedestal 100 may have a greater area than the substrate S. A vacuum hole H1, a vacuum groove H2, and a gas hole H3 may be formed in the first surface 101 of the pedestal 100.

The vacuum hole H1 of the pedestal 100 may be a hole formed at the central portion of the first surface 101 of the pedestal 100. The vacuum hole H1 may be connected to the vacuum pump 160 via the vacuum pipe 110. For example, a passage, such as a pipe, tunnel or other cavity (not shown) may be formed in the pedestal to connect the vacuum hole H1 to the vacuum pump 160 thus forming (with vacuum hole H1) a vacuum passage through the pedestal to connect the upper surface 101 of the pedestal 100 to the vacuum pump 160. The vacuum hole H1 may provide a vacuum pressure to regions below the substrate S. Also, referring to FIG. 1, plural vacuum holes H1 may be formed in the first surface 101r. For example, five vacuum holes H1 may be formed in the first surface 101. Description relating to a single vacuum hole H1 should be understood to apply to each of these plural vacuum holes H1 unless context indicates otherwise.

The vacuum hole H1 may be a cylindrical hole and, with respect to a top down view (or plan view) have a circular shape. Also, the diameter of the vacuum hole H1 may be in the range of 2 to 3 micrometers. For example, the diameter of the vacuum hole H1 may be about 2.5 micrometers. The size of the vacuum hole H1 will be described in more detail below with reference to FIGS. 3A and 3B.

The vacuum groove H2 of the pedestal 100 may be a groove formed in the first surface 101 and may extend from the vacuum hole H1, such as outwardly to a periphery of the pedestal 100, between vacuum holes H1 and/or between other vacuum grooves H2. The vacuum groove H2 may be connected to the vacuum hole H1 described herein. The vacuum groove H2 may be formed within portions of the first surface 101 of the pedestal 100 that underlie the substrate S in a vertical direction. The vacuum groove H2 may provide the vacuum pressure provided by the vacuum hole H1 to regions below the substrate S. The substrate S may be stably mounted on the first surface 101 of the pedestal 100 via the vacuum pressure transmitted by the vacuum groove H2. Plural vacuum grooves H2 may be provided (e.g., as shown) and each may extend from a vacuum hole H1. Description relating to a single vacuum groove H2 should be understood to apply to each of these plural vacuum grooves H2 unless context indicates otherwise A width d2 of the vacuum groove H2 may be in the range of 1.6 to 2.5 micrometers. For example, the width d2 of the vacuum groove H2 may be about 2.5 micrometers. Also, a depth d3 of the vacuum groove H2 may be in the range of 0.5 to 1.5 micrometers. For example, the depth d3 of the vacuum groove H2 may be about 0.6 micrometers. The size of the vacuum groove H2 will be described in more detail below with reference to FIGS. 4A through 4C.

Referring to FIG. 1, the vacuum groove H2 may include an azimuthal vacuum groove H2a and a radial vacuum groove H2b. The azimuthal vacuum groove H2a may have a shape surrounding the central portion of the first surface 101. For example, the azimuthal vacuum groove H2a may have a shape of a ring surrounding the central portion of the first surface 101 (e.g., a ring having a center corresponding to the center of the first surface 101). The azimuthal vacuum groove H2a may be formed in the first surface 101 in a multiple number. For example, a plurality of azimuthal vacuum grooves H2a may be arranged in the first surface 101 as rings concentric with each other (e.g., rings arranged at corresponding concentric circles). Also, the azimuthal vacuum groove H2a may be formed in an area of the first surface 101 of the pedestal 100 under the substrate S that is mounted on the first surface 101.

The radial vacuum groove H2b may extend across one or more of the azimuthal vacuum grooves H2a. For example, the radial vacuum groove H2b may intersect the azimuthal vacuum groove H2a. Also, the radial vacuum groove H2b may connect a plurality of azimuthal vacuum grooves H2a with one another. Since the plurality of azimuthal vacuum grooves H2a may be connected to one another by the radial vacuum groove H2b, the vacuum chuck 10 according to the inventive concept may provide the vacuum pressure to a larger lower area of the substrate S.

The gas hole H3 of the pedestal 100 may be a hole formed at a side portion of the first surface 101. The gas hole H3 may surround the vacuum grooves H2. For example, the gas hole H3 may have a ring shape surrounding the vacuum grooves H2. Also, the gas hole H3 may be formed in an area of the first surface 101 of the pedestal 100, that is not under the substrate S that is mounted on the first surface 101. In other words, when the substrate S is mounted on the first surface 101 of the pedestal 100, the gas hole H3 may not be covered by the substrate S and may be exposed to the atmosphere surrounding the upper surface of the substrate S (e.g., the inner space of chamber 20).

The gas hole H3 of the pedestal 100 may be connected to the bottom gas supply 170 via the gas pipe 120. The gas hole H3 may transmit a bottom gas provided by the bottom gas supply 170 to the substrate S. For example, the gas hole H3 may transmit the bottom gas to an edge of the substrate S.

According to an embodiment, the vacuum pipe 110 of the vacuum chuck 10 may be connected to the vacuum hole H1 formed in the first surface 101 of the pedestal 100. In more detail, the vacuum pipe 110 may connect the vacuum hole H1 with the vacuum pump 160. In some examples, the vacuum pipe 110 may have one or more horizontal components (not shown) extending within the pedestal 100 and have a terminal end at the vacuum hole H1. In some examples, vacuum pipe 110 may terminate at a tunnel (not shown) formed in the pedestal 100 which connects to vacuum hole H1.

According to an embodiment, the gas pipe 120 of the vacuum chuck 10 may be connected to the gas hole H3 formed in the first surface 101 of the pedestal 100. In more detail, the gas pipe 120 may connect the gas hole H3 with the bottom gas supply 170.

According to an embodiment, the heater 130 of the vacuum chuck 10 may be located inside the pedestal 100. The heater 130 may be configured to heat the substrate S on the first surface 101 of the pedestal 100.

The heater 130 may be provided in a multiple number for a local temperature control of the substrate S. The plurality of heaters 130 may emit heat to locally heat the first surface 101 of the pedestal 100. Also, the plurality of heaters 130 may be separately and individually controlled by the controller 190. The heater 130 may be a thermos-electric element, a resistance heater, an inductance heater or a combination thereof. However, it is not limited thereto, and the heater 130 may include other types of heaters.

According to an embodiment, a cover ring 140 of the vacuum chuck 10 may be connected to the pedestal 100. The cover ring 140 may be positioned on the outer edge of the pedestal 100 and configured to move up and down. For example, when processing the substrate S, the cover ring 140 may be positioned at its lowermost level and may contact the edge of the pedestal 100 (e.g., as shown in FIG. 2). In attaching and detaching the substrate S, the cover ring 140 may be positioned at its uppermost level and may be vertically spaced apart from the edge of the pedestal 100.

The cover ring 140 may be positioned on the pedestal 100 to overlap the edge of the substrate S. Since the cover ring 140 is positioned on the pedestal 100 to overlap the edge of the substrate S, the cover ring 140 may form a gas supply passage to provide the bottom gas provided by the gas hole H3 to the edge of the substrate S.

According to an embodiment, the clamp 150 of the vacuum chuck 10 may be configured to support the substrate S. For example, the clamp 150 may be configured to support the edge of the substrate S and situate the substrate S on the first surface 101 of the pedestal 100. The clamp 150 of the vacuum chuck 10 may be formed in a multiple number, and the plurality of clamps 150 may collectively support a bottom surface of the substrate S.

The clamp 150 may be coupled below the cover ring 140. For example, the clamp 150 may be coupled below the cover ring 140 and may be integral with the cover ring 140. Accordingly, when the cover ring 140 vertically moves on the pedestal 100, the clamp 150 may also vertically move.

According to an embodiment, the vacuum pump 160 of the vacuum chuck 10 may provide vacuum pressure to the vacuum hole H1 and the vacuum groove H2. The vacuum pump 160 may provide vacuum pressure to the vacuum hole H1 and the vacuum groove H2 via the vacuum pipe 110 (e.g., by generating vacuum pressure to which the vacuum pipe 110, vacuum hole H1 and vacuum groove H2 are exposed). The vacuum pressure may denote the pressure in a state where there is no air at all. However, it is not limited thereto, and the vacuum pressure may denote a pressure that is lower than that of the inner space of the chamber 20 above substrate S, such as a low pressure equal to or less than $10^{-3}$ mmHG. The substrate S may be stably mounted on the first surface 101 of the pedestal 100 via the vacuum pressure provided by the vacuum pump 160.

Also, the vacuum pump 160 may be connected to the controller 190. The vacuum pump 160 may provide the vacuum pressure of different magnitudes to the vacuum hole H1 and the vacuum groove H2 in response to commands provided by the controller 190. For example, controller 190 may select a vacuum pressure (e.g., as part of its programming), and the vacuum pump 160 may provide the selected vacuum pressure (a selected vacuum pressure from vacuum pressures of different magnitudes) to the vacuum hole H1 and the vacuum groove H2, according to a command of the controller 190 (e.g., the command taking into account a type of a substrate processing process or a degree of warpage of the substrate S). The vacuum pressure may be adjusted by the controller 190.

According to an embodiment, the bottom gas supply 170 of the vacuum chuck 10 may be configured to provide bottom gas to the gas hole H3. The bottom gas may be a gas provided by the bottom gas supply 170 for processing the substrate S (for example, for depositing a chemical material on the substrate S). However, it is not limited thereto, and the bottom gas may be a gas provided by the bottom gas supply 170 for heating the substrate S. For example, the bottom gas provided by the bottom gas supply 170 may include at least one of $H_2$ and Ar.

The bottom gas supply 170 may be connected to the controller 190. The bottom gas supply 170 may provide the bottom gas of different concentrations to the gas hole H3 in response to commands provided by the controller 190. For example, the bottom gas supply 170 may provide the bottom gas of different concentrations to the gas hole H3 according to a command of the controller 190, the command taking into account a type of a substrate processing process.

According to an embodiment, the elastic support 180 of the vacuum chuck 10 may be on the first surface 101 of the pedestal 100. In more detail, the elastic support 180 may be located on the first surface 101 of the pedestal 100 and may provide a vertical elastic force to the substrate S mounted on the first surface 101. When the substrate S is mounted on or detached from the pedestal 100, the elastic support 180 may provide the vertical elastic force to the substrate S. For example, the elastic support 180 may be and/or include a spring. Accordingly, when the substrate S is mounted on or detached from the pedestal 100, a risk of physical damage to the substrate S may be decreased.

The elastic support 180 may be provided in a multiple number. Also, the plurality of elastic supports 180 may be symmetrical with respect to one another based on the first surface 101 of the pedestal 100. For example, as illustrated in FIG. 1, the plurality of elastic supports 180 may include three elastic supports 180 that are symmetrical with respect to one another based on the first surface 101 of the pedestal 100.

According to an embodiment, the controller 190 of the vacuum chuck 10 may be configured to control at least one of the heater 130, the vacuum pump 160, and the bottom gas supply 170.

The controller 190 may control the heater 130. In more detail, according to a type of a substrate processing process, the controller 190 may control an amount of heat emission of the heater 130. Also, as described above, the heater 130 may be formed in a multiple number, and the controller 190 may separately control the plurality of heaters 130 for a local temperature control of the substrate S.

The controller 190 may control the vacuum pump 160. For example, according to a type of a substrate processing process, the controller 190 may control the magnitude of vacuum pressure provided by the vacuum pump 160 to the vacuum hole H1 and the vacuum groove H2. Also, according to a degree of warpage of the substrate S, the controller 190 may control the magnitude of vacuum pressure provided by the vacuum pump 160 to the vacuum hole H1 and the vacuum groove H2.

The controller 190 may control the bottom gas supply 170. For example, according to a type of a substrate processing process, the controller 190 may control the concentration of the bottom gas provided by the bottom gas supply 170. Also, according to a type of a substrate processing process, the controller 190 may determine the type of the bottom gas provided (e.g., by switching between different bottom gas supplies 170).

Figure 3A:
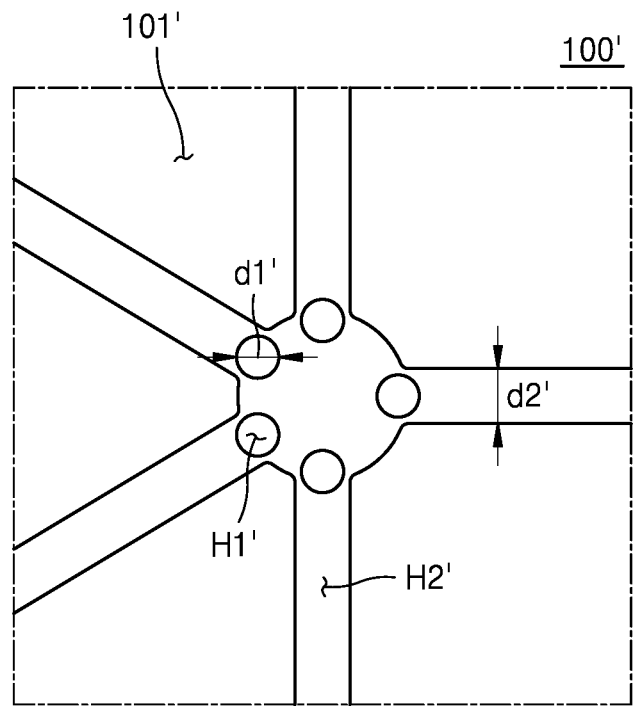
FIG. 3A is an enlarged view of a vacuum hole and a vacuum groove formed in a pedestal, according to a comparative embodiment.
Figure 3B:
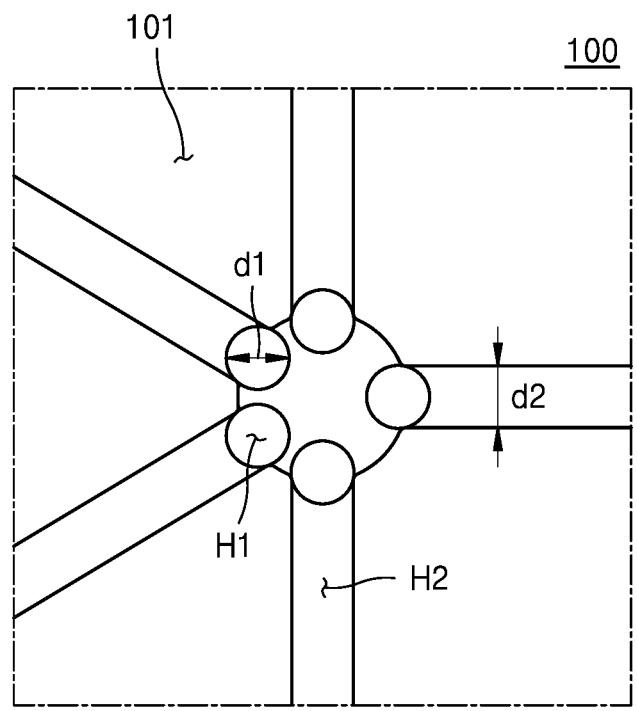
FIG. 3B is an enlarged view of a vacuum hole and a vacuum groove formed in a pedestal, according to an embodiment of the inventive concept.

FIG. 3A is an enlarged view of a vacuum hole H1' and a vacuum groove H2' formed on a pedestal 100' according to a comparative embodiment, and FIG. 3B is an enlarged view of the vacuum hole H1 and the vacuum groove H2 formed in the pedestal 100 according to an embodiment of the inventive concept.

As described above, in order to stably mount the substrate S on the pedestal 100, it may be important that the vacuum chuck 10 increases the suction power (or holding power) provided by the vacuum chuck 10 to the substrate S. One of the ways to increase the intensity of the suction power of the vacuum chuck 10 is to increase sizes of the vacuum hole H1 and the vacuum groove H2 formed in the first surface 101 of the pedestal 100. However, when the sizes of the vacuum hole H1 and the vacuum grove H2 are increased, an area of the first surface 101 of the pedestal 100, the area contacting the substrate S, may be decreased. Due to this, heat generated by the heater 130 may not be rapidly transmitted to the substrate S. Thus, when designing the sizes of the vacuum hole H1 and the vacuum groove H2 of the pedestal 100, both of the intensity of the suction power and the speed of the heat transmission should be considered.

The vacuum chuck 10 according to an embodiment of the inventive concept may increase the intensity of suction power while allowing rapid heat transmission to the substrate S.

Referring to FIG. 3A, a diameter d1' of the vacuum hole H1' formed in the pedestal 100' according to the comparative embodiment may be about 1.5 micrometers. In more detail, the vacuum hole H1' according to the comparative embodiment may be formed in the first surface 101' of the pedestal 100' as five holes each having a shape of a circle having the diameter d', which is about 1.5 micrometers.

Referring to FIG. 3B, the diameter d1 of the vacuum hole H1 formed in the pedestal 100 according to an embodiment of the inventive concept may be within a range of 2 to 3 micrometers. In more detail, the diameter d1 of the vacuum hole H1 formed in the pedestal 100 according to an embodiment of the inventive concept may be about 2.5 micrometers. For example, the vacuum hole H1 according to an embodiment of the inventive concept may be formed in the first surface 101 of the pedestal 100 as five vacuum holes H1 having a shape of a circle having the diameter d1 of about 2.5 micrometers.

The diameter d1 of the vacuum hole H1 formed in the pedestal 100 according to an embodiment of the inventive concept may be greater than the diameter d1' of the vacuum hole H1' formed in the pedestal 100' according to the comparative embodiment. Accordingly, with respect to a top down view of the pedestal 100 according to the inventive concept, an area of the vacuum hole H1 in the pedestal 100 may be greater than an area of the vacuum hole H1' in the pedestal 100' according to the comparative embodiment. Accordingly, the vacuum chuck 10 according to the inventive concept may provide a greater suction power than a vacuum chuck according to the comparative embodiment.

Also, the diameter d1 of the vacuum hole H1 according to an embodiment of the inventive concept may be substantially identical to the width d2 of the vacuum groove H2. Accordingly, the vacuum hole H1 and the vacuum groove H2 of the vacuum chuck 10 according to the inventive concept may improve the intensity of suction power provided to the substrate S.

Figure 4A:
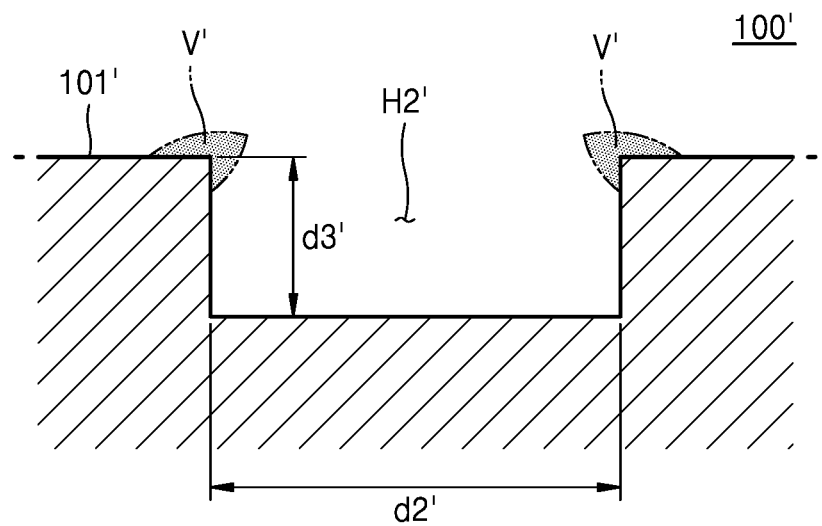
FIG. 4A is an enlarged cross-sectional view of a pedestal in which a vacuum groove is formed, according to a comparative embodiment.
Figure 4B:
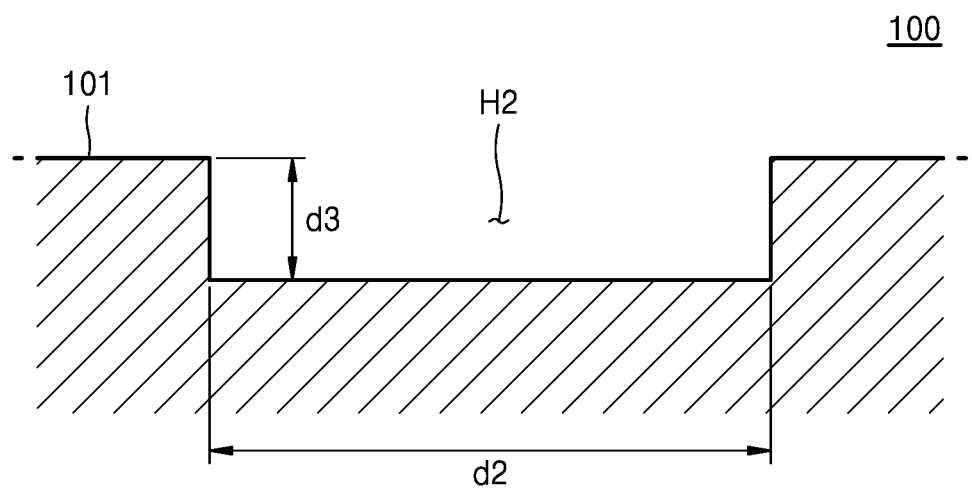
FIGS. 4B and 4C are enlarged cross-sectional views of a pedestal in which a vacuum groove is formed, according to an embodiment of the inventive concept.
Figure 4C:
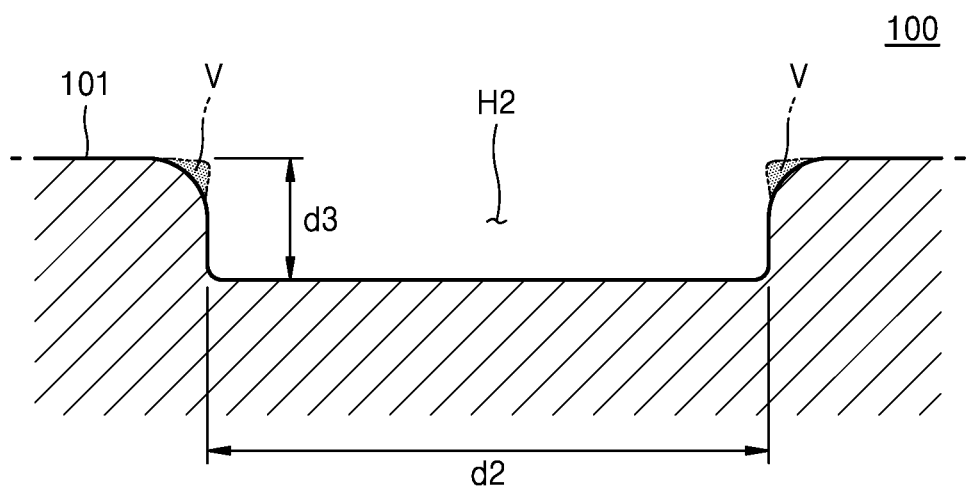

FIG. 4A is an enlarged cross-sectional view of the pedestal 100', in which a vacuum groove H2' is formed, according to a comparative embodiment, and FIGS. 4B and 4C are enlarged cross-sectional views of the pedestal 100, in which the vacuum groove H2 is formed, according to an embodiment of the inventive concept.

Referring to FIG. 4A, a width d2' of the vacuum groove H2' according to the comparative embodiment may be about 1.5 micrometers and a depth d3' of the vacuum groove H2' may be about 1.6 micrometers.

Also, according to the comparative embodiment, sidewalls of the vacuum groove H2' may join the upper horizontal portion of first surface 101' of the pedestal 100' at right angles. In other words, an angle formed by the first surface 101' of the pedestal 100' and the vertical inner surfaces (sidewalls) of the vacuum groove H2' may be a right angle.

As illustrated in FIG. 4A, when the pedestal 100' according to the comparative embodiment is repeatedly used, an upwardly projecting projection V' may be formed at an area in which the first surface 101' of the pedestal 100' and the sidewall of the vacuum groove H2' meet each other. For example, when the pedestal 100' including Al is repeatedly used, an upwardly projecting projection V' of $AlF_3$ may be formed at the location at which the first surface 101' of the pedestal 100' and the sidewalls of the vacuum groove H2' meet each other. The projection V' of $AlF_3$ may damage the substrate S in a process in which the substrate S is mounted on the pedestal 100' or in a process in which the substrate S is detached from the pedestal 100'.

Referring to FIG. 4B, the width d2 of the vacuum groove H2 according to an embodiment of the inventive concept may range between 1.6 to 2.5 micrometers. In more detail, the width d2 of each of the azimuthal vacuum groove H2*a* and the radial vacuum groove H2*b* formed in the first surface 101 of the pedestal 100 may be in a range between 1.6 to 2.5 micrometers.

For example, the width d2 of the vacuum groove H2 according to an embodiment of the inventive concept may be about 2.5 micrometers. When the width d2 of the vacuum groove H2 according to an embodiment of the inventive concept is about 2.5 micrometers, an area of the vacuum groove H2 in the first surface 101 of the pedestal 100 according to an embodiment of the inventive concept may be 1.7 times of an area of the vacuum groove H2' in the first surface 101' of the pedestal 100' according to the comparative embodiment. Accordingly, the vacuum chuck 10 according to the inventive concept may provide a greater suction power than the vacuum chuck according to the comparative embodiment.

Also, the depth d3 of the vacuum groove H2 according to an embodiment of the inventive concept may be in a range of 0.5 to 1.5 micrometers. In more detail, the depth d3 of each of the azimuthal vacuum groove H2*a* and the radial vacuum groove H2*b* formed in the first surface 101 of the pedestal 100 may be in a range of 0.5 to 1.5 micrometers.

For example, the depth d3 of the vacuum groove H2 according to an embodiment of the inventive concept may be about 0.6 micrometers. When the depth d3 of the vacuum groove H2 according to an embodiment of the inventive concept is about 0.6 micrometers, a volume of the vacuum groove H2 in the pedestal 100 according to an embodiment of the inventive concept may be less than a volume of the vacuum groove H2' in the pedestal 100' according to the comparative embodiment. Accordingly, a heat resistance formed by the vacuum groove H2 according to the inventive concept may be less than a heat resistance formed by the vacuum groove H2' according to the comparative embodiment. Accordingly, the vacuum chuck 10 according to the inventive concept may rapidly transmit the heat generated by the heater 130 to the substrate S.

Also, a vertical distance between the first surface 101 of the pedestal 100 and the heater 130 according to the inventive concept may be less than a vertical distance between the first surface 101' of the pedestal 100' and the heater 130 according to the comparative embodiment. Accordingly, the vacuum chuck 10 according to the inventive concept may rapidly transmit the heat generated by the heater 130 to the substrate S.

Referring to FIG. 4C, an inner surface of the vacuum groove H2 according to an embodiment of the inventive concept may be a curved surface. In other words, the first surface 101 of the pedestal 100 and the sidewalls of the vacuum groove H2 may not meet each other at right angles. For example, a corner portion at which the first surface 101 of the pedestal 100 and the sidewalls (inner surface) of the vacuum groove H2 meet each other may have a round or a chamfered shape.

According to an embodiment, curve of the corner portion starts from an about 50 percents to about 70 percents of the depth d3 of the vacuum groove H2 from bottom surface of the vacuum groove H2. For example, when the depth d3 of the vacuum groove H2 according to an embodiment of the inventive concept is about 0.6 micrometers, the curve of the corner portion starts from an about 0.3 micrometers to 0.42 micrometers distance apart from the bottom surface of the vacuum groove H2. A radius of the curvature of the corner portion is from about 0.5 micrometers to about 5 micrometers.

Thus, when the pedestal 100 according to the inventive concept is repeatedly used and a projection V such as $AlF_3$ is formed at the area in which the first surface 101 of the pedestal 100 and the inner surface of the vacuum groove H2 meet each other, the projection V may not project upwardly. Accordingly, in a process in which the substrate S is mounted on the pedestal 100 or in a process in which the substrate S is detached from the pedestal 100, the risk of physical damage to the substrate S may be reduced.

Figure 5:
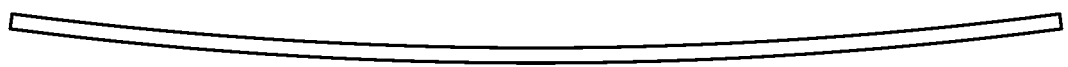
FIG. 5 is a cross-sectional view of a substrate having a bent state.

FIG. 5 is a cross-sectional view of the substrate S having a shape as a result of being mounted on the pedestal 100 of the vacuum chuck 10 according to the inventive concept.

Referring to FIG. 5, the substrate S mounted on the pedestal 100 of the vacuum chuck 10 may be a wafer in which semiconductor devices are formed. As semiconductor devices are formed on the substrate S in minute and complex manners, the substrate S mounted on the pedestal 100 of the vacuum chuck 10 may be downwardly bent.

According to an embodiment, considering a vertical cross-section of the substrate S, the substrate S may be bent to have a concave shape. For example, the substrate S may have a concave shape with the central portion of the substrate S lower than edges of the substrate S by at least 40 micrometers, such as between 40 to 60 micrometers.

Figure 6:
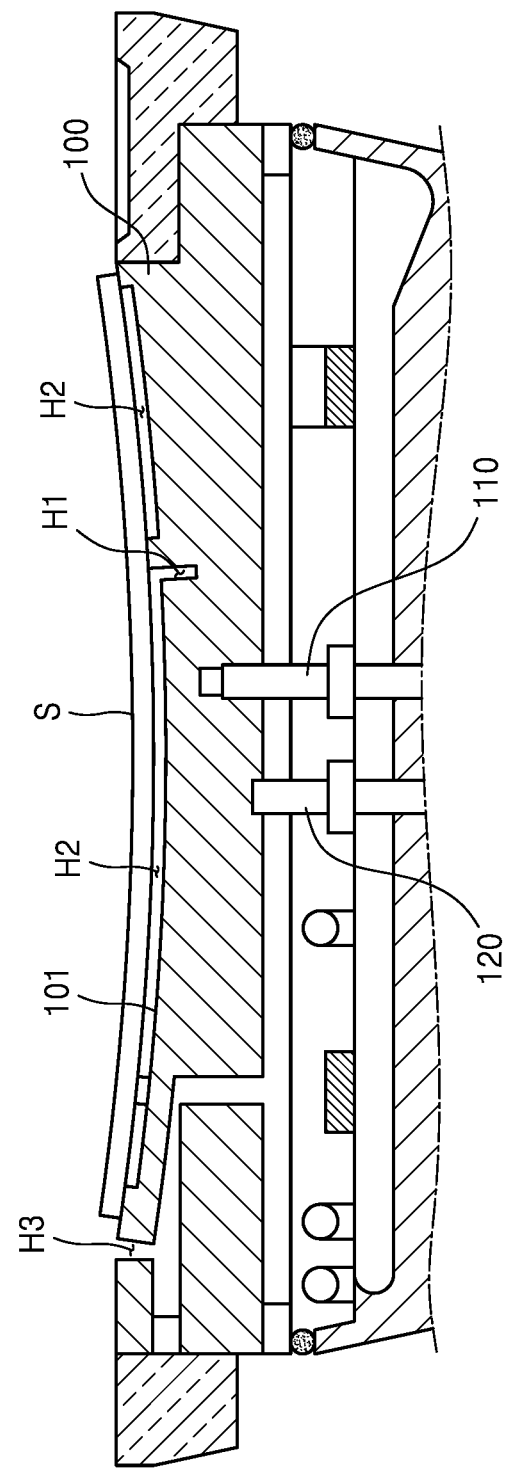
FIG. 6 is an enlarged cross-sectional view of an upper portion of a pedestal, according to an embodiment of the inventive concept.

FIG. 6 is an enlarged cross-sectional view of an upper portion of the pedestal 100 according to the inventive concept.

Referring to FIG. 6, the first surface 101 of the pedestal 100 according to the inventive concept may be curved to have a concave shape. In other words, considering a cross-section of the pedestal 100, the first surface 101 of the pedestal 100 may be a curved surface having a concave shape in which the central portion of the first surface 101 is at a lower height than the edge portions of the first surface 101.

The first surface 101 of the pedestal 100 may have substantially the same shape or a similar shape as the substrate S mounted on the first surface 101. For example, both the substrate S and the first surface 101 of the pedestal 100 may have a bowl shape (having a cross sectional shape of a circular arc) that is concave with respect to their upper surfaces.

The central portion of the first surface 101 of the pedestal 100 may be at a lower height than the edge portions of the first surface 101 by at least 40 micrometers, such as between 40 to 60 micrometers. In more detail, the central portion of the first surface 101 of the pedestal 100 may be at a lower height than the edge portions of the first surface 101 by about 50 micrometers. Accordingly, the substrate S may be stably mounted on the first surface 101 of the pedestal 100.

Figure 7A:
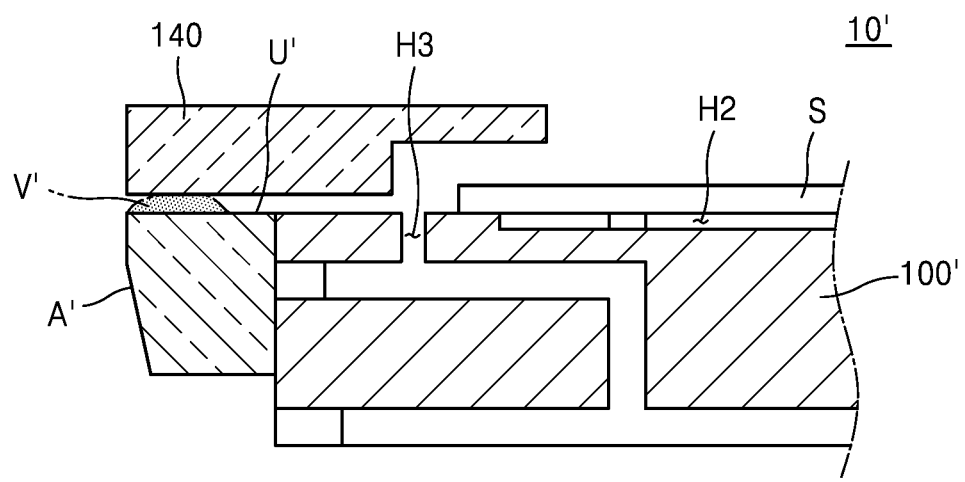
FIG. 7A is an enlarged cross-sectional view of a side portion of a vacuum chuck, according to a comparative embodiment.
Figure 7B:
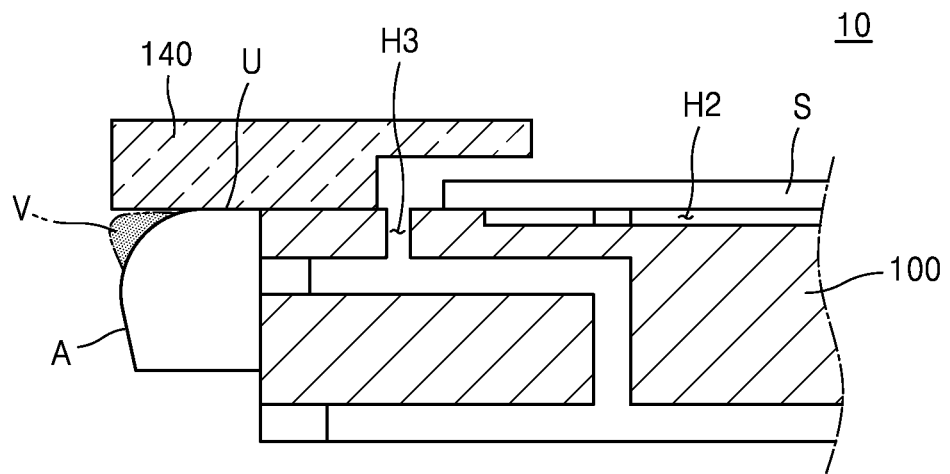
FIG. 7B is an enlarged cross-sectional view of a side portion of a vacuum chuck, according to an embodiment of the inventive concept.

FIG. 7A is a cross-sectional view of an enlarged side portion of a vacuum chuck 10' according to the comparative embodiment, and FIG. 7B is an enlarged cross-sectional view of a side portion of the vacuum chuck 10 according to an embodiment of the inventive concept.

Referring to FIG. 7A, the cover ring 140 of the vacuum chuck 10' according to the comparative embodiment may contact a side portion of the pedestal 100'. An upper surface U' of the side portion of the pedestal 100' according to the comparative embodiment may be a flat surface. The upper surface U' and a side surface A' of the side portion of the pedestal 100' may meet each other at an acute angle or perpendicular angle.

When the pedestal 100' of the vacuum chuck 10' according to the comparative embodiment is repeatedly used, the projection V may be formed on the upper surface U' of the side portion of the pedestal 100'. In more detail, when the pedestal 100' including Al according to the comparative embodiment is repeatedly used, a projection V' (such as formed of $AlF_3$) may be formed on the upper surface U of the side portion of the pedestal 100' and project upwardly. The projection V' of $AlF_3$ may prevent stable mounting of the cover ring 140' on the pedestal 100'.

Referring to FIG. 7B, an upper surface U of a side portion of the pedestal 100 according to the inventive concept may be curved. For example, the upper surface U of the side portion of the pedestal 100 may be curved to have a shape of a circular arc in which heights are decreased toward the outer portion of the upper surface U. In other words, the upper surface U of the side portion of the pedestal 100 may have an inclined surface downwardly inclined toward the outer portion thereof.

According to an embodiment, curve of the upper surface U at the outer portion of the pedestal 100 starts at about 80 percents or more of the radius of the upper surface from the center of the pedestal 100.

When the pedestal 100 of the vacuum chuck 10 according to the inventive concept is repeatedly used, the projection V of $AlF_3$ may be formed on the upper surface U of the side portion of the pedestal 100. In more detail, the projection V of $AlF_3$ may be formed on the downwardly inclined surface of the side portion of the pedestal 100. Since the upper surface U of the side portion of the pedestal 100 may have the cross sectional shape of a circular arc in which heights are decreased toward the outer portion of the upper surface U of the side portion, the cover ring 140 may be stably mounted on the pedestal 100 without interruption of the projection V of $AlF_3$.

Figure 8:
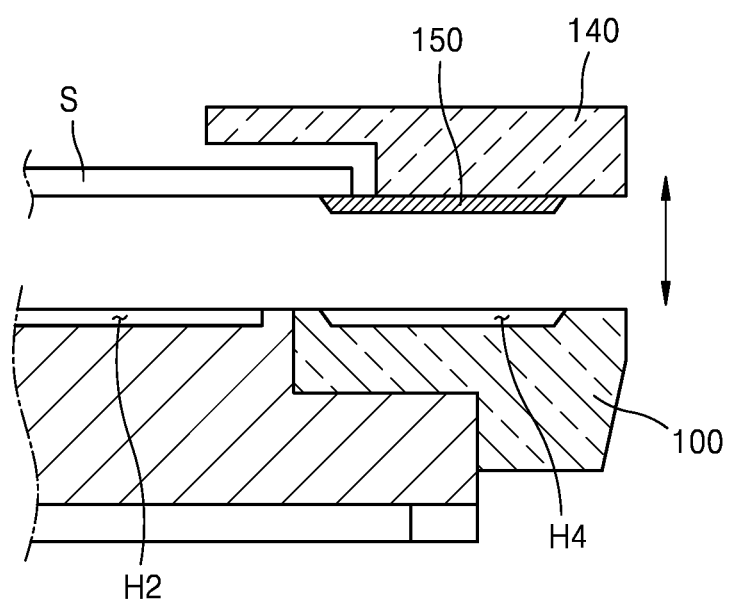
FIG. 8 is an enlarged cross-sectional view of a side portion of a vacuum chuck, according to an embodiment of the inventive concept.

FIG. 8 is an enlarged cross-sectional view of a side portion of the vacuum chuck 10 according to an embodiment of the inventive concept.

As described above, the clamp 150 according to the inventive concept may support the substrate S. Referring to FIG. 8, the clamp 150 may be coupled below the cover ring 140. For example, the clamp 150 may be coupled below the cover ring 140 and may move together with the cover ring 140. Accordingly, when the cover ring 140 vertically moves, the clamp 150 may also vertically move.

Also, a clamp groove H4 may be formed at a side portion of the pedestal 100. The clamp groove H4 may provide a space in which the clamp 150 may be positioned. For example, when the substrate S is mounted on the pedestal 100, the clamp 150 may downwardly move to be located inside the clamp groove H4 formed in the pedestal 100.

Here, the clamp 150 may not be exposed to the outside (i.e., to the inner space defined by chamber 20). For example, the entire bottom surface and side surfaces of the clamp 150 may be inserted in and encased by pedestal 100. The clamp groove H4 may have a shape conforming to the shape of the clamp 150 (e.g., a negative of the clamp) and may have its surfaces contact the corresponding surfaces of the clamp 150 when the clamp 150 is positioned therein. Also, when the substrate S is detached from the pedestal 100, the clamp 150 may upwardly move to be located above the clamp groove H4 formed in the pedestal 100. In this latter configuration, the clamp 150 may be exposed to the outside.

Since the clamp 150 may be coupled below the cover ring 140 and may be located inside the clamp groove H4 formed at the side portion of the pedestal 100, the size of the vacuum chuck 10 according to the inventive concept may be reduced.

FIG. 9 is a view showing a substrate processing apparatus 1 according to an embodiment of the inventive concept. The substrate processing apparatus 1 according to the inventive concept may be an apparatus for performing a substrate processing process, such as a semiconductor manufacturing process such as a deposition process, an etching process, ion implantation process or a cleaning process. The substrate processing apparatus 1 may be a chemical vapor deposition (CVD) coating machine (such as a plasma enhanced chemical vapor deposition) and perform a CVD (e.g., PECVD) deposition of a layer of a semiconductor device. Deposition of the layers by the substrate processing apparatus 1 may include atomic layer deposition (ALD) and epitaxial growth of crystalline semiconductor layers. The substrate processing apparatus 1 may be etching equipment that performs wet etching (e.g., by spraying a liquid etchant) or dry etching (e.g., by generating a plasma) of the substrate S (e.g., to pattern a layer of the substrate S). The substrate processing apparatus 1 may be a system to perform ion implantation to selectively dope a semiconductor substrate and/or semiconductor layers of substrate S with charge carrier dopants. The substrate processing apparatus 1 according to the inventive concept may include a chamber 20, the vacuum chuck 10, a pressure pump 30, a top fluid supply 40, etc.

Referring to FIG. 9, the chamber 20 of the substrate processing apparatus 1 may define an inner space in which the substrate S is processed. The inner space may include various environments according to a type of a substrate processing process. For example, the temperature, humidity, and pressure of the inner space may be regulated according to a type of the substrate processing apparatus. Also, the inner space defined by the chamber 20 may provide a space in which the vacuum chuck 10 and the top fluid supply 40 are located.

According to an embodiment, the vacuum chuck 10 of the substrate processing apparatus 1 may be configured to stably mount the substrate S in a process for processing the substrate S and to heat the substrate S in a process for processing the substrate S.

Plural vacuum chuck 10 according to any of the embodiments described herein may be provided in the inner space of the chamber 20. However, the inventive concept is not limited thereto, and a single vacuum chuck 10 may be provided in the inner space of the chamber 20. Also, when there are a plurality of vacuum chucks 10 in the chamber 20, the plurality of vacuum chucks 10 may be separately controlled. For example, the plurality of vacuum chucks 10 in the chamber 20 may perform the same substrate processing processes or different substrate processing processes.

The vacuum chuck 10 according to the inventive concept may include the pedestal 100, the vacuum pipe 110, the gas pipe 120, the heater 130, the cover ring 140, the clamp 150, the vacuum pump 160, the bottom gas supply 170, the elastic support 180, and the controller 190 as described elsewhere herein. Technical aspects of the vacuum chuck 10 according to the inventive concept are substantially described with reference to FIGS. 1 through 8, and thus, detailed descriptions thereof are omitted.

The pressure pump 30 according to the inventive concept may be configured to regulate the pressure in the inner space defined by the chamber 20. For example, the pressure pump 30 may increase the pressure in the inner space of the chamber 20 by injecting a gas into the inner space. Also, the pressure pump 30 may decrease the pressure in the inner space by discharging gas from the inner space of the chamber 20. Also, the pressure pump 30 may make the inner space of the chamber 20 as a vacuum state as compared to the atmosphere external to the chamber 20 (e.g., make the inner space of chamber 20 less than atmospheric pressure).

The top fluid supply 40 according to the inventive concept may be provided in the inner space of the chamber 20 and may be positioned above the vacuum chuck 10. For example, the top fluid supply 40 may be coupled to an upper internal surface of the chamber 20.

According to an embodiment, the top fluid supply 40 may be configured to supply a processing fluid onto the substrate S. The processing fluid may be a processing gas or a processing liquid for processing the substrate S. The processing gas may be a gas used as part of the semiconductor process for processing the substrate S. For example, the processing gas may include nitrogen, hydrogen, argon, etc. The processing gas may be an inert gas and/or may include a precursor gas used to form a plasma, etchant, cleaning substance, deposition material, etc. However, it is not limited thereto, and the top fluid supply 40 may supply various types of processing gases onto the substrate S.

Also, the top fluid supply 40 may be configured to supply the processing fluid onto the substrate S. The processing liquid may be a liquid for processing the substrate S. For example, the processing liquid may be a polymer material, deionized water, etc. However, it is not limited thereto and the top fluid supply 40 may supply various types of processing liquids onto the substrate S.

The top fluid supply 40 may include a nozzle 41 to inject and spray the processing fluid onto the substrate S. The nozzle 41 may be formed on the top fluid supply 40 toward the substrate S and may be provided in a multiple number.

According to an embodiment, when the nozzle 41 of the top fluid supply 40 supplies the processing fluid into the chamber (which may be onto or about the upper surface of substrate S) for a substrate processing process (for example, a substrate deposition process), the bottom gas supply 170 of the vacuum chuck 10 may also provide bottom gas to the substrate S through the gas hole H3. During a deposition process, the bottom gas supply 170 may provide the bottom gas to the substrate S through the gas hole H3 and as a result, a deposition layer having a uniform thickness may be formed on the substrate S. When the bottom gas supply 170 provides the bottom gas to the substrate S through the gas hole H3 in the substrate processing process, a difference between a thickness of the deposition layer formed on the central portion of the substrate S and a thickness of the deposition layer formed on the edge portion of the substrate S may be reduced. Accordingly, the performance of semiconductor devices formed on the substrate S may become uniform.

Figure 10A:
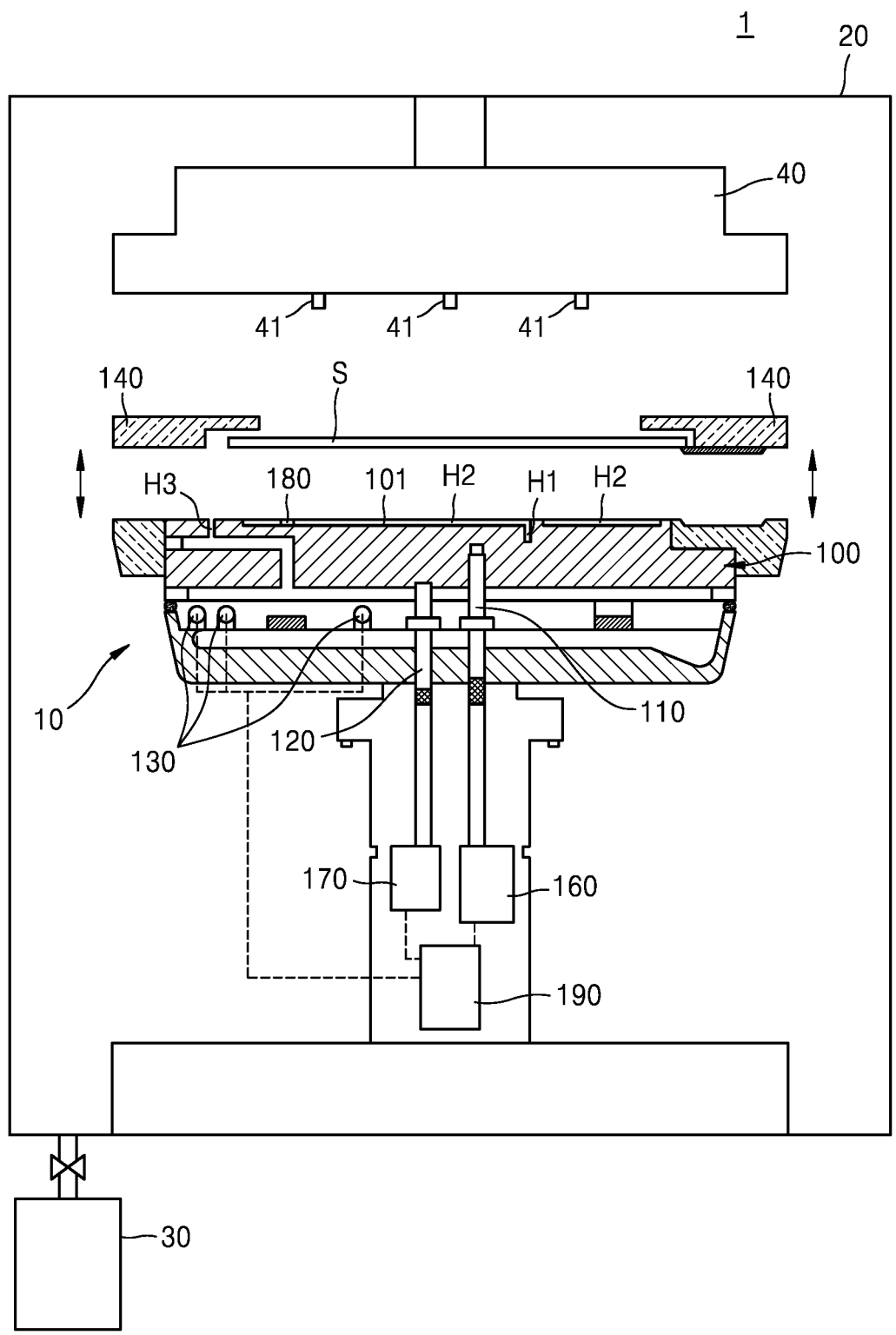
FIG. 10A is a view showing a substrate processing apparatus in a first state, according to an embodiment of the inventive concept.
Figure 10B:
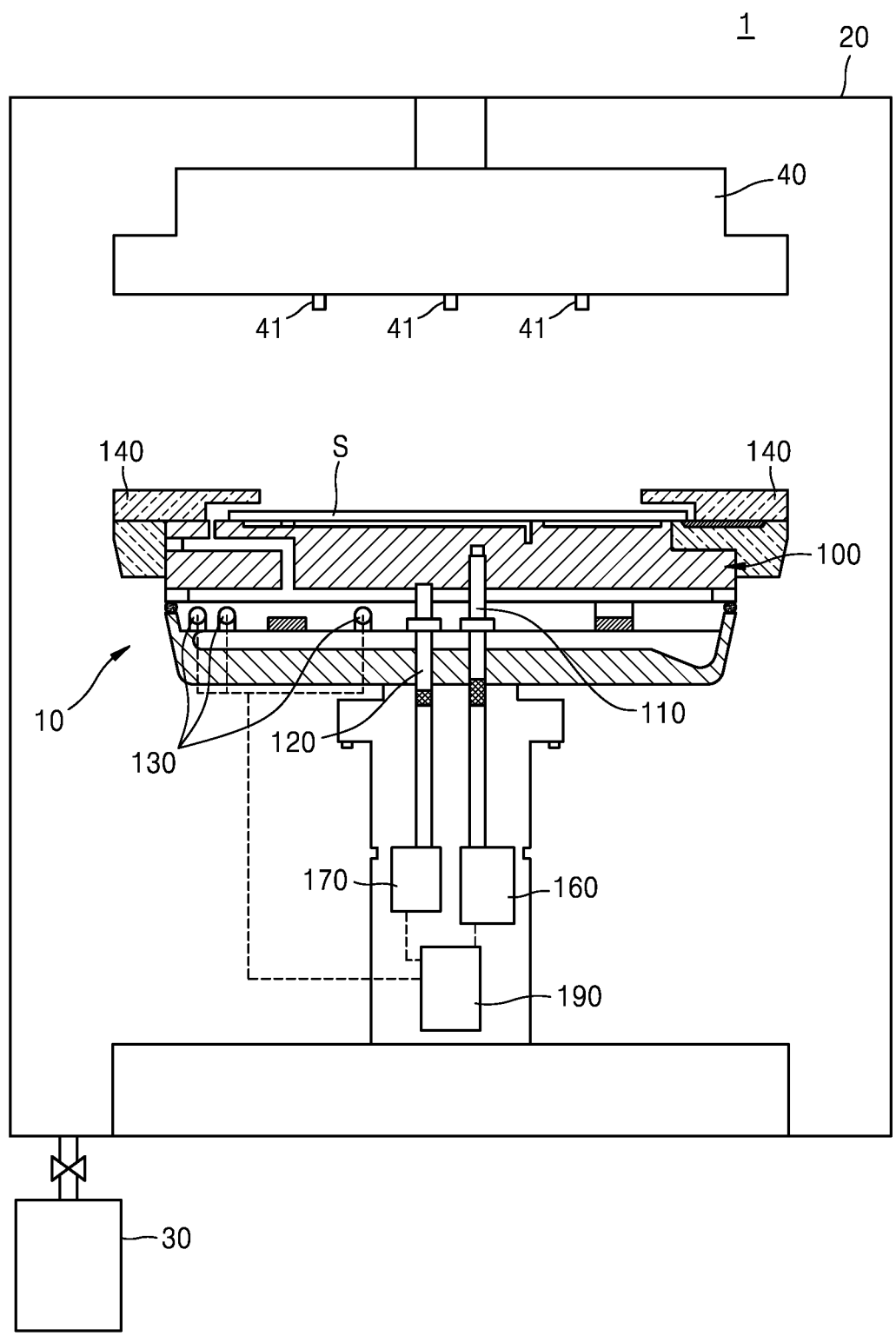
FIG. 10B is a view showing a substrate processing apparatus in a second state, according to an embodiment of the inventive concept.

FIG. 10A is a view showing the substrate processing apparatus 1 in a first state, according to an embodiment of the inventive concept, and FIG. 10B is a view showing the substrate processing apparatus 1 in a second state, according to an embodiment of the inventive concept. The substrate processing apparatus 1 may be the same as those described herein. Hereinafter, a substrate processing process, which the substrate processing apparatus 1 performs on the substrate S, is described by referring to FIGS. 10A and 10B.

Referring to FIG. 10A, the substrate processing apparatus 1 may be in the first state. The first state of the substrate processing apparatus 1 may be a state in which the substrate S is not mounted on the vacuum chuck 10 and is spaced apart from the vacuum chuck 10. The first state of the substrate processing apparatus 1 of FIG. 10A may be a state before the substrate S is processed (i.e., before mounting substrate S on vacuum chuck 1) or a state after the substrate S is processed (after substrate S was mounted and processed on vacuum chuck 1).

According to an embodiment, when the substrate processing apparatus 1 is in the first state, the cover ring 140 and the clamp 150 may be spaced apart from the pedestal 100. When the substrate processing apparatus 1 is in the first state, the substrate S may be mounted on the clamp 150 in the first state and may be fixed for performing the substrate processing process. Also, when the substrate processing apparatus 1 is in the first state, the substrate S may be detached from the clamp 150 in the first state to move to another chamber 20, after the substrate processing process with vacuum chuck 1.

Referring to FIG. 10B, the substrate processing apparatus 1 may be in the second state. The second state of the substrate processing apparatus 1 may be a state in which the substrate S is mounted on the vacuum chuck 10 and the substrate S is processed.

According to an embodiment, when the substrate processing apparatus 1 is in the second state, the cover ring 140 may contact the pedestal 100. Also, as described above, the clamp 150 coupled below the cover ring 140 may be located in the clamp groove H4 of the pedestal 100. When the substrate processing apparatus 1 is in the second state, the substrate S may be mounted on the vacuum chuck 10 and may be processed.

According to an embodiment, when the substrate processing apparatus 1 is in the second state (that is, when the substrate S is mounted on the vacuum chuck 10 and processed), at least one of the pressure pump 30, the top fluid supply 40, the heater 130, the vacuum pump 160, and the bottom gas supply 170 of the substrate processing apparatus 1 according to the inventive concept may operate.

For example, when the substrate processing apparatus 1 is in the second state, the pressure pump 30, the top fluid supply 40, the heater 130, the vacuum pump 160, and the bottom gas supply 170 according to the inventive concept may simultaneously operate for a substrate deposition process.

Also, when the substrate processing apparatus 1 is in the second state, the heater 130 according to the inventive concept may operate to heat the substrate S.

Embodiments of the invention also include methods of manufacturing semiconductor devices, such as integrated circuits integrally formed as a semiconductor chip. The method of manufacturing a semiconductor device may comprise processing a substrate S with the substrate processing apparatus 1 with the substrate S mounted on vacuum chuck 10 as described herein. The substrate S may be an initial substrate (e.g., a bulk crystalline substrate, SOT, etc.) or an intermediate product later formed in a semiconductor manufacturing process. The substrate S may be processed while mounted on the vacuum chuck 10 according to the embodiments described herein. For example, the substrate S may be subject one or more of the following semiconductor manufacturing processes while mounted to a vacuum chuck 10 such as with a substrate processing apparatus 1 described herein: ion implantation to implant charge carrier dopants in a semiconductor layer of the substrate; deposition of an insulation layer on the substrate S (e.g., via CVD); deposition of a conductive layer (e.g., metal) on the substrate S (e.g., via CVD); patterning of an insulation layer or a conductive layer (e.g., using a photoresist mask and/or hard mask to selective etch a layer, such as insulation layer or conductive layer (e.g., by wet or dry etching)); deposition of a photoresist layer (which may be patterned using a lithographic process); and developing an exposed photoresist layer to form a photoresist pattern. Exemplary details of the structure and operation of the vacuum chuck 10 and the substrate processing apparatus 1, related substrate processing, and the substrate S have been described above and may be used in performing the method of manufacturing a semiconductor device according to embodiments of the present invention. The method of manufacturing a semiconductor device may result in plural semiconductor devices formed in a wafer and further include singulating the semiconductor devices (e.g., cutting the semiconductor devices from the wafer) and packaging the semiconductor devices.

While the inventive concept has been particularly shown and described with reference to embodiments thereof, it will be understood that various changes in form and details may be made therein without departing from the spirit and scope of the following claims.

What is claimed is:

1. A vacuum chuck comprising:
a pedestal comprising a first surface configured to have a substrate mounted thereon, the pedestal having a vacuum groove formed in the first surface and a vacuum hole in fluid communication with the vacuum groove, wherein the vacuum groove and vacuum hole form a vacuum passage configured to provide a vacuum pressure below the substrate;
a heater in the pedestal, the heater being configured to generate heat; and
a vacuum pipe connected to the vacuum hole,
wherein the vacuum hole has a diameter in the range of 2 to 3 micrometers, and
the vacuum groove has a width in the range of 1.6 to 2.5 micrometers.

2. The vacuum chuck of claim 1, wherein
the vacuum groove has a depth in the range of 0.5 to 1.5 micrometers.

3. The vacuum chuck of claim 1, wherein
the diameter of the vacuum hole is the same as the width of the vacuum groove.

4. The vacuum chuck of claim 1, wherein
the first surface of the pedestal comprises a curved surface having a concave shape in which a central portion of the curved surface is at a lower height than an edge of the curved surface.

5. The vacuum chuck of claim 4, wherein
the central portion of the first surface is at a lower height than the edge of the first surface by at least 40.

6. The vacuum chuck of claim 1, wherein
an upper surface of the pedestal of a side portion of the pedestal comprises a curved surface in which a height of the upper surface of the side portion of the pedestal decreases in a direction toward an outer portion of the pedestal.

7. The vacuum chuck of claim 1, further comprising:
a vacuum pump configured to provide vacuum pressure to the vacuum pipe; and
a controller configured to control at least one of the vacuum pump and the heater,
wherein the controller is configured to control the vacuum pump to provide a selected one of different vacuum pressures as the vacuum pressure provided below the substrate to accommodate a degree of warpage of the substrate.

8. A vacuum chuck comprising:
a pedestal comprising a first surface configured to have a substrate mounted thereon, the pedestal having a vacuum groove formed in the first surface and a vacuum hole in fluid communication with the vacuum groove, wherein the vacuum groove and vacuum hole form a vacuum passage configured to provide a vacuum pressure below the substrate, the pedestal having a gas hole formed in the first surface and surrounding the vacuum groove configured to transmit a bottom gas to the substrate;
a heater in the pedestal, the heater being configured to generate heat;
a vacuum pipe connected to the vacuum hole;
a vacuum pump configured to provide vacuum pressure to the vacuum pipe;
a gas pipe connected to the gas hole;
a bottom gas supply configured to provide bottom gas to the gas pipe;
a cover ring on the pedestal, the cover ring configured to overlap an edge portion of the substrate; and
a clamp configured to support the substrate,
wherein the first surface is a flat surface or a concave surface configured to contact the substrate, and
wherein sidewalls of the vacuum groove meet with the first surface at respective rounded corner portions forming respective curved surfaces.

9. The vacuum chuck of claim 8, wherein
wherein a diameter of the vacuum hole is in a range of 2 to 3 micrometers, and
wherein a width of the vacuum groove is in a range of 1.6 to 2.5 micrometers, and
wherein a depth of the vacuum groove is in a range of 0.5 to 1.5 micrometers.

10. The vacuum chuck of claim 8, wherein
a clamp groove is formed in the first surface of the pedestal at an edge of the pedestal and is configured to have the clamp inserted therein, and
the clamp is coupled below the cover ring and is configured to move together with the cover ring.

11. The vacuum chuck of claim 8, wherein
the first surface of the pedestal comprises the concave surface in which a central portion of the first surface is at a lower height than an edge of the first surface, and
the central portion of the first surface is at the lower height than the edge of the first surface by at least 40 micrometers.

12. The vacuum chuck of claim 8, further comprising
an elastic support on the first surface of the pedestal, the elastic support being configured to provide a vertical force to the substrate.

13. The vacuum chuck of claim 8, further comprising
a controller configured to control at least one of the heater, the vacuum pump, and the bottom gas supply, wherein the controller is configured to control the vacuum pump to provide a selected one of different vacuum pressures as the vacuum pressure provided below the substrate to accommodate a degree of warpage of the substrate.

14. A substrate processing apparatus for processing a substrate comprising:
a chamber defining an inner space configured to process a substrate;
a vacuum chuck configured to support the substrate in the inner space;
a pressure pump configured to regulate pressure in the inner space; and
a top gas supply above the vacuum chuck, the top gas supply comprising a nozzle configured to inject a fluid into the chamber,
wherein the vacuum chuck comprises:
a pedestal comprising a first surface configured to have the substrate mounted thereon, the pedestal having a first vacuum groove formed in the first surface and a first vacuum hole in fluid communication with the first vacuum groove, wherein the first vacuum groove and first vacuum hole form a vacuum passage configured to provide a vacuum pressure below the substrate, and the pedestal having a gas hole formed in the first surface and surrounding the first vacuum groove configured to transmit a bottom gas to the substrate;
a heater in the pedestal, the heater being configured to generate heat;
a vacuum pipe connected to the first vacuum hole; and
a gas pipe connected to the gas hole,
wherein a diameter of the first vacuum hole is in a range of 2 to 3 micrometers, and
a width of the first vacuum groove is in a range of 1.6 to 2.5 micrometers.

15. The substrate processing apparatus of claim 14, wherein
a depth of the first vacuum groove is in a range of 0.5 to 1.5 micrometers.

16. The substrate processing apparatus of claim 14, wherein the first surface of the pedestal has formed therein:
a plurality of azimuthal vacuum grooves surrounding a central portion of the first surface; and
a radial vacuum groove connecting the plurality of azimuthal vacuum grooves with one another,
wherein inner surfaces of each of the plurality of azimuthal vacuum grooves and the radial vacuum grooves comprise curved surfaces.

17. The substrate processing apparatus of claim 14, further comprising:
a vacuum pump configured to provide the vacuum pressure to the vacuum pipe;
a bottom gas supply configured to provide the bottom gas to the gas pipe; and
a controller configured to control at least one of the heater, the vacuum pump, and the bottom gas supply,
wherein the controller is configured to control the vacuum pump to provide a selected one of different vacuum pressures as the vacuum pressure provided below the substrate to accommodate a degree of warpage of the substrate and configured to control the heater to heat the substrate to a selected one of different temperatures according to accommodate a type of a substrate processing.

18. The substrate processing apparatus of claim 17, wherein
the bottom gas supply is further configured to supply at least one of hydrogen and argon.

19. The substrate processing apparatus of claim 14, wherein
the first surface of the pedestal comprises a curved surface having a concave shape in which a central portion of the first surface is at a lower height than an edge of the first surface, and
the central portion of the first surface is at the lower height than the edge of the first surface by 40 to 60 micrometers.

20. The substrate processing apparatus of claim 14, wherein
an upper surface of the pedestal of a side portion of the pedestal comprises a curved surface in which a height of the upper surface of the side portion of the pedestal decreases in a direction toward an outer portion of the pedestal, and
an inner surface of the first vacuum groove comprises a curved surface, wherein the first surface of the pedestal and the inner surface of the first vacuum groove do not meet at a right angle.

* * * * *